United States Patent [19]

Sharp et al.

[11] 4,229,519

[45] Oct. 21, 1980

[54] PHOTO-POLYMERIZABLE WATER-DEVELOPABLE COMPOSITION AND ELEMENTS

[75] Inventors: Gerald B. Sharp, Harrow; Karel L. Petrak, North Harrow; John H. Boielle, Tring; Hans M. Wagner, Stanmore; John F. Langford, Berkhamsted, all of United Kingdom

[73] Assignee: Eastman Kodak Company, Rochester, N.Y.

[21] Appl. No.: 44,273

[22] Filed: May 31, 1979

[30] Foreign Application Priority Data

May 31, 1978 [GB] United Kingdom ............... 25437/78

[51] Int. Cl.[2] .......................... G03C 1/68; G03C 5/00
[52] U.S. Cl. .................................... 430/287; 430/306; 204/159.18; 204/159.25; 204/159.24; 525/204; 525/214; 525/281; 525/292
[58] Field of Search ...................... 204/159.18, 159.23, 204/159.24; 430/286, 287, 288, 306

[56] References Cited

U.S. PATENT DOCUMENTS

| 2,727,019 | 12/1955 | Melamed | 260/79.7 |
|---|---|---|---|
| 2,876,216 | 3/1959 | Anderson et al. | 260/88.3 |
| 3,288,770 | 11/1966 | Butler | 260/88.3 |
| 3,538,064 | 11/1970 | Yacowitz | 260/88.3 |

FOREIGN PATENT DOCUMENTS

| 742232 | 12/1955 | United Kingdom . |
|---|---|---|
| 846601 | 8/1960 | United Kingdom . |
| 1447142 | 8/1976 | United Kingdom . |
| 1463816 | 2/1977 | United Kingdom . |
| 1495529 | 12/1977 | United Kingdom . |

*Primary Examiner*—Jack P. Brammer
*Attorney, Agent, or Firm*—Dana M. Schmidt

[57] ABSTRACT

There is disclosed a radiation-sensitive composition and element comprising (a) a water-soluble polymer containing a quaternized nitrogen in a 5-membered ring and (b) a photoinitiator, and processes for preparing the polymer and for using the composition.

10 Claims, No Drawings

PHOTO-POLYMERIZABLE WATER-DEVELOPABLE COMPOSITION AND ELEMENTS

FIELD OF THE INVENTION

The invention relates to radiation-sensitive polymer compositions suitable for use as a radiation-sensitive element, and a method for making a polymer useful in the composition.

SUMMARY OF THE INVENTION

The invention provides radiation-sensitive compositions which can be imagewise exposed to radiation and developed to form, for example, a lithographic printing plate or a resist image. In the presence of a photoinitiator, the polymer of the composition is polymerized or crosslinked on exposure to radiation of a suitable wavelength to render the polymer insoluble or less-soluble in a solvent for the polymer. Advantageously, the exposed composition may be developed using water or an aqueous solution. The polymer may be soluble and/or swellable in the developer. Because of the toughness and resistance to solvents of the compositions when cured by exposure to radiation, they may be used for a variety of surface coating applications.

In accordance with the invention there is provided a radiation-sensitive composition and an element made therefrom comprising a polymer containing recurring units with the structure

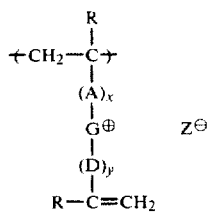

wherein G is a 5-membered ring containing a quaternized nitrogen,
each R independently represents —H or —CH$_3$;
A is alkylene; oxyalkylene;

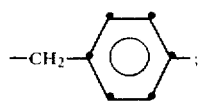

—COO(CH$_2$)$_a$OOCCH$_2$—; or —CONH(CH$_2$)$_b$-HNOCCH$_2$—;

D is alkylene; oxyalkylene; —CH$_2$COOCH$_2$CH$_2$OOC—; —CH$_2$CONH(CH$_2$)$_b$HNOC—; —(CH$_2$)$_b$OOC—; or

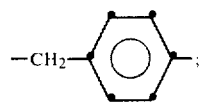

a represents 1, 2 or 3;
b represents 2 or 3;
x represents 0 or 1;
y represents 0 or 1; and
Z$^\ominus$ is an anion; and a photoinitiator comprising a trihalomethane derivative and a metal carbonyl compound or a metallocene.

Such a polymer can be formed by adding an ethylenically unsaturated quaternizing agent to a polymer containing a 5-membered tertiary nitrogen-containing ring.

DESCRIPTION OF THE PREFERRED EMBODIMENT

The polymer of the radiation-sensitive composition can be a homopolymer or a copolymer having a recurring unit of the structure identified above as (I). As used herein, "5-membered ring" includes substituted or unsubstituted rings, such as

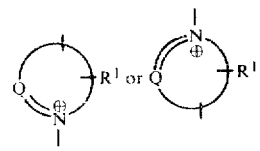

wherein R$^1$ is hydrogen; alkyl of from 1 to 5 carbon atoms such as methyl, ethyl and the like; or aryl of from 6 to 10 carbon atoms, e.g., phenyl and naphthyl.

A comonomer is preferred as a means for conferring particular properties to the polymer, e.g., to make the polymer film-forming or to provide the polymer with a desired degree of water insolubility. In the manufacture of lithographic printing plates, it is necessary for the photo-hardened polymer to be hydrophobic so that it is ink-receptive. It may be advantageous for the polymer to be a copolymer where the comonomer is used to provide the hydrophobic-hydrophilic balance required of the polymer before and after it is further polymerized or crosslinked.

A comonomer can be used which provides the polymer with repeating units having the formula

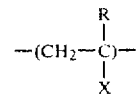

wherein
R represents —H or —CH$_3$; and
X is phenyl; —CN; —COOR$_3$; or

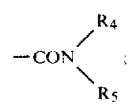

R$_3$ is alkyl having from 1 to 4 carbon atoms; and,
R$_4$ and R$_5$, independently, is hydrogen or alkyl having from 1 to 4 carbon atoms.

Suitable comonomers which may be employed include lower alkyl acrylates and methacrylates, e.g., methylmethacrylate; styrene; acrylonitrile and methacrylonitrile; N-alkyl acrylamides and methacrylamides, e.g., isopropylacrylamide; and, vinyl alkyl ethers.

The proportion of comonomer employed may be varied in order to provide the polymer with the optimum properties. For example, in the preparation of a methylmethacrylate-N-vinylimidazole prepolymer represented by repeating units of the formula:

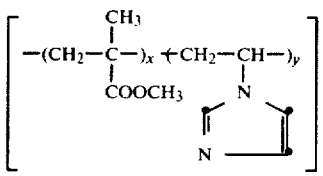

the ratio of x:y was varied to find the ratio which provided the quaternized polymer with the best properties. It was found that when x:y is greater than 3:1 the quaternized polymer is too insoluble for development by an aqueous developer while if x:y is greater than 1:4 the polymer is too soluble. An x:y ratio in the region of 1:1 proved most satisfactory.

A prepolymer used in the preparation of the quaternary nitrogen-containing polymer will not usually possess the water-developable property of the quaternary nitrogen-containing polymer.

The photoinitiator preferably comprises a trihalomethane derivative in combination with either a metal carbonyl compound or a metallocene. The trihalomethane derivative can form part of the polymer, i.e., the polymer may contain trihalomethane groups, or it may be a separate compound. When a separate compound is used it is preferably soluble in the composition and non-volatile.

It can be advantageous to use an ethylenically unsaturated trihalomethane derivative which will copolymerize with the polymer on exposure to radiation. Examples of such compounds include

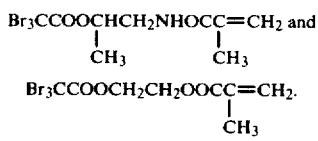

Examples of saturated trihalomethane derivatives which can be used include alkyl esters and amides of tribromoacetic acid and alkyl esters of tribromoethanol. Specific examples include $Br_3CCH_2OH$
$Br_3CCOOC_4H_9$
$Br_3CCOO(CH_2)_{11}CH_3$
$Br_3CCH_2COO(CH_2)_{10}CH_3$
$Br_3CCONHC_6H_{13}$
$Br_3CCONH(CH_2)_{11}CH_3$.

A copolymerizable trihalomethane derivative can be employed in an amount of from 5 to 80 percent by weight based on the weight of the polymer. Preferably, the trihalomethane derivative is employed in an amount of from 5 to 20 percent by weight.

Suitable metal carbonyl and metallocene compounds include those disclosed in U.K. Patent Specification Nos. 1,463,816 and 1,495,529, respectively.

A particularly suitable metal carbonyl compound is that represented by the formula $ArM(CO)_3$ wherein Ar represents a six-electron donor ligand, e.g., benzene, and M represents a metal of Group VIa of the Mendeleeff periodic table, e.g., chromium.

The metal carbonyl or metallocene compound may be used in an amount of from 1 to 20 percent, preferably 2 to 5 percent, by weight based on the weight of the polymer.

Copolymerizable monomers can be employed in an amount of from 5 to 80 percent, preferably 10 to 20 percent, by weight based on the weight of the polymer. Suitable monomers include those disclosed in U.K. Patent Specification No. 1,463,816.

Conventional additives such as dyes, pigments, plasticizers and thermal polymerization inhibitors may also be present in the composition.

In another aspect, the invention also provides a radiation-sensitive material comprising a support coated with a layer of a polymer composition of the invention. The material may be prepared by coating a support with a solution of the polymer composition and evaporating the solvent. It may be advantageous for the coating solution to be an aqueous solution. The coating solution may be applied by a wide variety of techniques including whirler coating and dip coating.

Suitable supports include those made of metal, plastics, glass and paper.

In a preferred embodiment of the invention the support is a lithographic support, e.g., an aluminum foil.

The coating may be continuous or discontinuous, e.g., in a pattern.

Activating radiation may be applied uniformly to the radiation-sensitive material to insolubilize all the polymer present or it may be applied selectively to insolubilize only certain areas of the coating. Thus, for example, in the preparation of photoresists or lithographic printing plates a suitable coated support is imagewise exposed to radiation.

The radiation used to insolubilize the polymers of the invention may be electromagnetic or particle radiation. For example, light, an electron beam or X-rays may be used. Generally, the polymer may be sensitized, if necessary, to the type of radiation employed.

In a preferred application, a radiation-sensitive material of the invention may be used to prepare a lithographic printing plate. More particularly, the invention provides a process for preparing such a plate which process comprises imagewise exposing the material to radiation for a time sufficient to polymerize or crosslink the polymer in the image areas and removing the unexposed polymer with an aqueous solution.

U.V. light may be used to imagewise expose the material.

The polymers of the composition can be prepared by a process which comprises quaternizing a polymer comprising units containing a 5-membered tertiary nitrogen-containing ring with an ethylenically unsaturated quaternizing agent.

The reaction may be carried out by heating the polymer and the quaternizing agent together in an organic solvent, e.g., methanol or dimethyl formamide.

The reaction may conveniently be carried out at a temperature of from 60° to 100° C. Preferably, the polymer and quaternizing agent are used in stoichiometric proportions.

Polymers of the invention derived from N-vinylimidazole or a substituted N-vinylimidazole are believed to provide imaging that is superior in speed and image discrimination to that obtainable from adjacent homolog polymers. Preferably, the polymer is a copolymer, e.g., poly(methylmethacrylate-co-N-vinylimidazole).

The quaternizing agent may be an ethylenically unsaturated halide, e.g., vinylbenzyl chloride and chloromethylcarbonyloxyethylmethacrylate.

In another embodiment, the invention provides a process for preparing a polymer comprising units containing a quaternary nitrogen atom and an ethylenically unsaturated group which process comprises quaternizing an ethylenically unsaturated tertiary nitrogen-containing compound with a polymeric quaternizing agent.

The reaction may be carried out by heating the ring compound and the quaternizing agent together in an organic solvent.

The reaction may conveniently be carried out at a temperature of from 60° to 100° C. Preferably, the tertiary nitrogen-containing compound and the quaternizing agent are used in stoichiometric proportions.

The quaternizing agent may be a polymer having halogen-substituted side chains. Preferred quaternizing agents include chloroacetic acid esters of hydroxyl-containing polymers. Another preferred quaternizing agent is poly(chloromethylstyrene).

The invention is further illustrated by way of example as follows:

EXAMPLE 1—Synthesis of Poly(methylmethacrylate-co-N-vinylimidazole)

Dioxane was purified by column chromatography on active neutral alumina.

Freshly distilled methylmethacrylate (20 g) and N-vinylimidazole (18.8 g, B.A.S.F., distilled 194° C./760 mm) were placed in a 500 ml three-necked round-bottomed flask, fitted with a stirrer, nitrogen inlet and a condenser. Dioxane (200 ml) was added, and the flask was placed in a thermostated oil bath at 90° C. Nitrogen was bubbled through the flask and stirring was started. Azodi-isobutyronitrile (A.I.B.N.) (0.38 g) was added. Stirring and heating was continued for 20 hours. During this time the polymer began to precipitate. The polymer was then obtained by precipitating it from the latex-like dispersion into ether (2 l). The solid was washed well with ether, and dried under vacuum at room temperature. The polymer had a log viscosity number of 21 (methanol at 25° C.). Yield (30 g).

$(C_{10}H_{14}N_2O_2)_n$ Required: C, 61.85; H, 7.22; N, 14.43%. Found: C, 58.4; H, 7.1; N, 12.8%.

EXAMPLE 2—Synthesis of Poly(methylmethacrylate-co-N-vinyl benzylvinylimidazolium)chloride The copolymer of Example 1 (9.7 g) was dissolved in methanol (100 ml) by heating to reflux on the steam bath. Vinylbenzyl chloride (7.6 g Dow Chemical, 40% p and 60% m isomer b.p. 60° C./2 mm) was added, followed by 'Topanol OC'* (0.2 g). The solution was heated under reflux for 20 hours and the polymer was isolated from the solution by precipitation into ether (2 l). The polymer was washed with ether, filtered and dried under vacuum. Yield (10 g). Log viscosity number 48 (methanol at 25° C.).
*Trademark of I.C.I. Limited.

$(C_{19}H_{23}ClN_2O_2)_n$ Required: N, 8.1; Cl, 10.24%. Found: N, 8.4; Cl, 9.7%.

EXAMPLE 3—Synthesis of N-(2-Tribromomethylcarbonyloxypropyl)methacrylamide

N-(2-Hydroxypropyl)methacrylamide (7.15 g) was dissolved in dichloroethane (150 ml) in a 500 ml three-necked round-bottomed flask, fitted with a stirrer, two dropping funnels and a nitrogen supply. The flask was cooled to 0° C. by means of an ice/salt freezing mixture, stirring was started and the reaction was blanketed with dry nitrogen. 'Topanol OC', a butylated hydroxy toluene stabilizer, (0.1 g) was added. Tribromoacetylbromide (18 g) was added dropwise, simultaneously with triethylamine (5.1 g) over a period of 30 minutes, keeping the temperature between 0° and −5° C. While stirring the mixture was then slowly allowed to come to room temperature. After four hours the precipitated salts were filtered off, washed with dichloroethane, and the washings and filtrate were combined. The solvent was removed under vacuum by a rotary evaporator leaving an oil residue. This was dissolved in a mixture of water and ethanol and on standing the product crystallized as a colorless solid. It was recrystallized from the same solvent mixture. Yield (13 g) m.p. 104°-105° C.

EXAMPLE 4

A coating composition was made up as follows:

| | |
|---|---|
| Polymer described in Example 2 | 1 g |
| Monomer described in Example 3 | 0.8 g |
| Benzene chromium tricarbonyl | 0.05 g in 0.5 ml acetone |
| n-Propanol | 10 ml |

The above solution was coated onto a 5"×5" grained phosphoric acid anodized aluminum foil, which was unsubbed, on a whirler coating machine at 150 rpm. The plate was spun for two minutes at room temperature and eight minutes at 30° C.

Part of the plate was then exposed in a vacuum frame, through a 0.15 density increment step tablet, to four 125 w high pressure mercury vapor lamps at a distance of 18 inches for five seconds.

The exposed coating was then developed in demineralized water. After removal of the unexposed areas, the non-image areas were desensitized with Kodak Polymatic Desensitizer Gum solution. The plate was then given a further wipe with a cotton pad dampened with deionized water and the plate was inked. The last step to ink-up solidly was recorded as ten.

EXAMPLE 5

A coating composition was made up as follows:

| | |
|---|---|
| Polymer described in Example 2 | 1 g |
| Monomer described in Example 3 | 0.8 g |
| Methylene bisacrylamide | 0.8 g |
| Benzene chromium tricarbonyl | 0.05 g |
| n-Propanol | 10 ml |
| Deionized water | 5 ml |

The procedure of Example 4 of coating, exposure and development was then carried out except the exposure time was increased to thirty seconds. After removal of the unexposed areas with demineralized water, the non-image areas were desensitized with Kodak Polymatic Desensitizer Gum solution. The plate was then inked and the last step to ink-up solidly was recorded as eleven.

EXAMPLE 6—Synthesis of Trichloromethylcarbonyloxyethylmethacrylate

Hydroxyethylmethacrylate (13.0 g) was placed in a 250 ml, three-necked, round-bottomed flask, fitted with a stirrer, air condenser and two dropping funnels, as well as a thermometer. The apparatus was placed in an ice/salt freezing bath. Dichloroethane (100 ml) was added, followed by the simultaneous dropwise addition of triethylamine (10.1 g) and trichloroacetyl chloride (18.2 g). During the addition the temperature was not allowed to rise above 2° C. After the addition was complete, the mixture was stirred for a further 6 hours, during this time the temperature rose gradually to room temperature. The mixture stood overnight, and the precipitated salt was filtered off, and the residue was washed thoroughly with dichloroethane. The washings and the filtrate were combined and the solvent was removed on a rotary evaporator. The residue still contained some solid. It was dissolved in ether, the ether solution was washed with water (3 times). The solution was then dried ($MgSO_4$), filtered, and the solvent was removed under vacuum. The residue was distilled under high vacuum, collecting the fraction, boiling between 84°–90° C./0.1 mm (16 g).

$C_8H_9Cl_3O_4$ Required: C, 34.84; H, 3.25; Cl, 38.65%. Found: C, 35.5; H, 3.4; Cl, 40.3%.

EXAMPLE 7—Synthesis of Chloromethylcarbonyloxyethylmethylacrylate

The method of preparation was similar to that described in Example 6. Hydroxyethylmethacrylate (39 g) was dissolved in dichloroethane (250 ml), in a 1 l. three-necked, round-bottomed flask, fitted with a stirrer, two dropping funnels, an air condenser, connected to a nitrogen supply, and a thermometer. With ice/salt cooling, triethylamine (30.3 g) and chloroacetyl chloride (33.9 g) were added simultaneously at such a rate that the temperature did not rise above 5° C. in a nitrogen atmosphere. The mixture was then stirred overnight at room temperature, the triethylamine hydrochloride which had precipitated was filtered off and washed with dichloroethane. The washings and the filtrate were combined, and the solvent was removed on a rotary evaporator. 'Topanol OC' (0.1 g) was added to the residue, which was distilled under high vacuum, the fraction boiling between 80°–94° C./0.1 mm was collected. It was redistilled, after the addition of a further quantity of 'Topanol OC' (0.1 g), collecting the fraction boiling at 90° C./0.1 mm (30 g).

$C_8H_{11}ClO_4$ Required: C, 46.48; H, 5.33; Cl, 17.19%. Found: C, 48.48; H, 5.72; Cl, 15.5%.

EXAMPLE 8—Synthesis of N-(2-Chloromethylcarbonyloxypropyl)methacrylamide

The compound was prepared by the method described in Example 7, using N-(2-hydroxypropyl)methacrylamide (14.3 g), dichloroethane (200 ml), chloroacetyl chloride (11.3 g) and triethylamine (10.1 g). The product distilled at 112° C./0.1 mm (12 g) and was obtained as a viscous oil.

$C_9H_{14}ClNO_3$ Required: C, 49.20; H, 6.38; Cl, 16.17; N, 6.38%. Found: C, 49.62; H, 6.70; Cl, 15.95; N, 6.68%.

EXAMPLE 9—Synthesis of Poly(ethylmethacrylate)-co-(N-vinylimidazole)

A 250 ml three-necked, round-bottomed flask, fitted with a stirrer, condenser and nitrogen inlet was placed in a thermostated oil bath, set at 90° C. Ethyl methacrylate (11.4 g) and N-vinylimidazole (18.8 g) together with dioxane (purified, see Example 1; 75 ml) were placed in the flask. Nitrogen was bubbled through the flask, stirring was started, and A.I.B.N. (0.15 g) was added. After heating for 2½ hours, a further quantity of ethyl methacrylate (11.4 g) and N-vinylimidazole (9.4 g), A.I.B.N. (0.075 g) and dioxane (25 ml) was added. Heating was continued overnight. Ethanol was then added to the milky solution and the polymer was isolated by precipitation into ether. It was washed with ether, and dried under vacuum (38 g).

$(C_{11}H_{16}N_2O_2)_n$ Required: C, 62.50; H, 7.69; N, 13.46%. Found: C, 60.71; H, 7.28; N, 15.7%.

EXAMPLE 10—Synthesis of Poly(methylmethacrylate)-co-(2-methyl-N-vinylimidazole)

The method of Example 1 was followed, using methylmethacrylate (10 g) and 2-methyl-N-vinylimidazole (10.8 g), together with A.I.B.N. (0.10 g) in dioxane (100 ml). The polymer was isolated by precipitation into ether, and dried under vacuum (15 g).

$(C_{11}H_{16}N_2O_2)_n$ Required: N, 13.46%. Found: N, 11.74%.

N.M.R. spectroscopic analysis showed that the ratio of methyl methacrylate to 2-methyl-1-vinyl imidazole was 1.3:1.

EXAMPLE 11—Synthesis of Poly(ethylmethacrylate)-co-methyl-N-vinylimidazole)

Again, the method of Example 1 was followed using, ethylmethacrylate (11.4 g) and 2-methyl-N-vinylimidazole (10.8 g), A.I.B.N. (0.11 g) and dioxane solvent (100 ml). The polymer was isolated as before (14 g).

$(C_{12}H_{18}N_2O_2)_n$ Required: N, 12.62%. Found: N, 9.4%.

EXAMPLE 12—Synthesis of Poly(methylmethacrylate)-co-(chloromethylcarbonyloxyethylmethacrylate)

The method of Example 1 was used, with the following monomer charge:

| | |
|---|---|
| Methylmethacrylate | 5.0 g |
| Chloromethylcarbonyloxyethylmethacrylate | 10.32 g |
| A.I.B.N. | 0.076 g |
| Dioxane | 75 ml |

Yield = 10 g.

$(C_{13}H_{19}ClO_6)_n$ Required: Cl, 11.58%. Found: Cl, 9.4%.

EXAMPLE 13—Synthesis of Poly(chloromethylstyrene)

Vinylbenzyl chloride (40/60 p-, m-mixture, Dow Chemical 97% pure by GLC; 0.2 mole, 30.5 g) was dissolved in benzene (Na dry, 250 ml) together with azo-bisisobutyronitrile initiator (1 mole %, 0.33 g), and the mixture was stirred at the reflux temperature under $N_2$ for about 20 hours. The polymer was then precipitated into methanol, the solid was filtered off and dried under vacuum to give 17 g (56% yield) of a white powder.

$(C_9H_9Cl)_n$ Required: C, 71.10; H, 5.96; Cl, 23.25%. Found: C, 71.14; H, 6.08; Cl, 23.55%.

EXAMPLE 14—Quaternization of Polymer of Example 9 With Chloromethylstyrene

Copolymer Example 9 (10.4 g) was dissolved in DMF (100 ml). The solution in a 250 ml round-bottomed flask was placed in a thermostated oil bath held at 95° C. Chloromethylstyrene (Dow, 7.5 g) was added. After heating overnight, the polymer was isolated from the solution by precipitation into ether. The polymer was dried under vacuum and then dissolved in methanol. The solid polymer was isolated from this solution by reprecipitation into ether. It was collected and dried under vacuum (12 g).

$(C_{20}H_{25}ClN_2O_2)_n$ Required: Cl, 9.85%. Found: Cl, 9.0%.

EXAMPLE 15—Quaternization of Polymer of Example 10 With Chloromethylstyrene

The method of Example 14 was employed, using the same quantities but employing the copolymer of Example 10. The polymer was isolated as described in Example 14 (14 g).

$(C_{20}H_{25}ClN_2O)_n$ Required: Cl, 9.85%. Found: Cl, 8.83%.

EXAMPLE 16—Quaternization of Polymer of Example 10 with Chloromethylcarbonyloxyethylmethacrylate Again, the method of Example 14 was followed. The following materials were used:

| Copolymer, Example 10 | 10.4 g |
|---|---|
| Chloromethylcarbonyloxyethylmethacrylate | 10.3 g |
| DMF | 100 ml |

The polymer was isolated as before (15 g).
$(C_{19}H_{27}ClN_2O_6)_n$ Required: Cl, 8.56%. Found: Cl, 7.70%.

EXAMPLE 17—Quaternization of Polymer of Example 12 With N-vinylimidazole

The method of Example 14 was employed, using the following charge:

| Copolymer, Example 12 | 7.66 g |
|---|---|
| N-Vinylimidazole | 2.3 g |
| DMF | 75 ml |

The polymer was isolated as in Example 14. It was redissolved in ethanol and reprecipitated in ether (7 g).
$(C_{18}H_{25}ClN_2O_6)_n$ Required: Cl, 9.09%. Found: Cl, 7.30%.

EXAMPLE 18—Quaternization of Polymer of Example 11 With Chloromethylcarbonyloxyethylmethacrylate The method of Example 14 was used, and the charge was as follows:

| Copolymer, Example 11 | 11.1 g |
|---|---|
| chloromethylcarboxyethylmethacrylate | 10.3 g |
| DMF | 100 ml |
| Yield of polymer | 16 g |

$(C_{18}H_{27}ClN_2O_4)_n$ Required: Cl, 9.58%. Found: Cl, 6.9%.

EXAMPLE 19—Quaternization of Polymer of Example 13 With N-vinylimidazole

Poly(vinylbenzyl chloride) ($3.3 \times 10^{-2}$ mole, 5.1 g) and 1-vinylimidazole ($1.6 \times 10^{-2}$ mole, 1.5 g) were dissolved in dimethyl formamide (100 ml) and the mixture was kept stirring at 80° C. for 18 hours. A white precipitate formed in the reaction mixture during that time. The mixture was rendered homogeneous by adding methanol (50 ml), and the final polymeric product was isolated by precipitating into ethyl acetate (about 2 l). The solid was filtered and then dried under vacuum to give 6 g of a white powder, soluble in water and methanol. The overall yield was 91%.

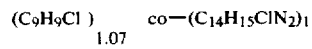

Required: C, 67.38; H, 5.91; N, 6.83%. Found: C, 64.43; H, 6.01; N, 6.84%.

EXAMPLE 20

A coating composition was made up as follows:

| Polymer described in Example 19 | 5.0 g |
|---|---|
| Monomer described in Example 3 | 4.25 g |
| Mesitylene chromium tricarbonyl | 1.25 g |
| Acetone | 6.25 ml |
| Methanol | 56.25 ml |

The mesitylene chromium tricarbonyl was dissolved in a mixture of 6.25 ml acetone and 6.25 ml methanol. This was then added to a solution of the other constituents in the remainder of the methanol. The resulting solution was then coated onto a 10"×15" phosphoric acid anodized aluminum foil at 120 rpm. The procedure of drying, exposure and development used in Example 4 was then carried out except that the exposure time was increased to 60 seconds. After development the non-image areas were desensitized with Kodak Polymatic Plate Finisher, and then 30,000 prints were obtained on an A.B. Dick 350 press. The last step to ink-up solidly was recorded as six, and no sign of wear was seen on the plate at the end of the run.

EXAMPLE 21

Coating compositions were made up as follows, using polymers listed below:

| Polymer | 1 g |
|---|---|
| Monomer described in Example 3 | 0.2 g |
| Benzene chromium tricarbonyl | 0.05 g |
| Orasol Red B (CIBA) | 0.02 g |
| Leuco propyl violet | 0.04 g |
| Methylethyl ketone | 8 ml |
| Methanol | 4 ml |

The procedure of Example 4 of coating, exposure and development was carried out except that the whirler speed was decreased to 120 rpm, and the exposure time was increased to 60 seconds. After desensitization of the non-image areas with Kodak Polymatic Plate Finisher comprising phosphoric acid, polyvinyl pyrrolidone, sodium hexametaphosphate, aluminum nitrate, and sodium hydroxide, the image areas were inked. The last step to ink-up solidly was recorded as in the following list.

|                                   | Last Step to Ink-Up Solidly |
|---|---|
| Polymer described in Example 14   | 9 |
| Polymer described in Example 15   | 9 |
| Polymer described in Example 16   | 5 |
| Polymer described in Example 17   | 4 |
| Polymer described in Example 18   | 5 |
| Polymer described in Example 19   | 7 |

Addition of leuco propyl violet provided the layers with a "print-out" image which was visible after exposure. Addition of Orasol Red B provided a red color to the layers which was retained in image areas after development.

EXAMPLE 22

A coating composition was made up as follows:

| Polymer described in Example 19 | 1 g |
|---|---|
| Monomer described in Example 6 | 0.2 g |
| Benzene chromium tricarbonyl | 0.05 g |
| Methanol | 4 ml |
| Methyl ethyl ketone | 8 ml |

The procedure of Example 4 of coating, exposure and development was then carried out except the exposure time was increased to 60 seconds. After desensitization with Kodak Polymatic Plate Finisher the image areas were inked and the last step to ink-up solidly was recorded as four.

EXAMPLE 23—Synthesis of Tribromomethylcarbonyloxyethylmethacrylate

The method described in Example 6 was followed using the following charge:

| Hydroxyethylmethacrylate | 13 g |
|---|---|
| Triethylamine | 10.2 g |
| Dichloroethane | 190 ml |
| Tribromoacetyl bromide | 36 g |

After the final removal of the solvent, the product was used without distillation. It was a pale straw colored liquid.

$C_8H_9Br_3O_4$ Required: C, 23.47; H, 2.20; Br 58.67%. Found: C, 26.90; H, 2.90; Br 56.7%.

EXAMPLE 24—Synthesis of N-(2-chloromethylformamidoethyl)methacrylamide

2-Aminoethylmethacrylamide hydrochloride (16.4 g) was dissolved in water (50 ml) and sodium hydroxide solution (40 ml; 10% w/v) was added. With stirring and cooling in an ice bath, chloroacetyl chloride (11.3 g) in toluene (30 ml) was added dropwise and simultaneously with enough 10% w/v sodium hydroxide solution to keep the solution at pH 8. A solid began to precipitate. Stirring the mixture was continued for 2 hours and it was then refrigerated overnight. The product was then filtered, washed with water and dried under vacuum (11.5 g) m.p. 126°–128° C.

$C_8H_{13}ClN_2O_2$ Required: C, 46.94; H, 6.35; Cl, 17.36; N, 13.69%. Found: C, 46.63; H, 6.60; Cl, 17.20; N, 13.20%.

EXAMPLE 25—Quaternization of Polymer of Example 10 With N-(2-chloromethylformamidoethyl)methacrylamide The method of Example 14 was followed by using the following charge:

| Polymer, Example 10 | 10.4 g |
|---|---|
| DMF | 100 ml |
| N-(2-chloromethylcarbonamidoethyl)-methacrylamide | 10.2 g |
| Yield | 16 g |

$(C_{19}H_{29}ClN_4O_4)_n$ Required: C, 55.26; H, 7.03; Cl, 8.61; N, 13.56%. Found: C, 52.25; H, 6.89; Cl, 7.26; N, 12.73%.

EXAMPLE 26—Synthesis of Poly(methylmethacrylate)-co-(N-vinylimidazole)

(a) Monomer feed ratio 1:1. Methylmethacrylate (20 g) and N-vinylimidazole (18.8 g) were dissolved in a 3:1 v/v mixture of ethanol and acetone (150 ml) in a 500 ml three-necked round-bottomed flask, fitted with a magnetic stirrer, a nitrogen inlet tube dipping below the surface of the liquid, and a condenser. The apparatus was placed in a thermostated oil bath set at 70° C. A.I.B.N. (0.19 g) was added and the solution was heated and stirred overnight while nitrogen was continuously bubbled through the solution. The polymer was isolated by pouring the viscous solution into water (4 l) with rapid stirring. The colorless fibrous solid was collected and dried under vacuum at 50° C. (26 g).

$(C_{10}H_4N_2O_2)_n$ Required: C, 61.85; H, 7.22; N, 14.43%. Found: C, 59.39; H, 7.54; N, 7.94%.

N.M.R. spectroscopy analysis showed that the methyl methacrylate to N-vinylimidazole ratio was 2.4:1.

(b) Monomer feed ratio 1:2, the method described above was followed exactly except that after 1 hour reaction a further quantity of N-vinylimidazole (18.8 g) was added. The yield of polymer was (30 g).

$(C_{15}H_{20}N_4O_2)_n$ Required: C, 62.5; H, 6.94; N, 19.45%. $(C_{10}H_4N_2O_2)$ Required: C, 61.85; H, 7.22; N, 14.43%. Found: C, 60.25; H, 7.54; N, 12.09%.

N.M.R. spectroscopy analysis gave a monomer ratio of 1:1.

(c) Monomer feed ratio 2:3. The method for preparation (a) was followed except that the following charge was used:

| Methyl methacrylate | 20 g |
|---|---|
| N-vinylimidazole | 28.2 g |
| A.I.B.N. | 0.24 g |
| Ethanol/acetone 3:1 v/v mixture | 160 ml |

Twenty-six grams of a colorless powder were obtained.

$(C_{25}H_{34}N_6O_4)$ Required: C, 62.24; H, 7.54; N, 17.42%. $(C_{15}H_{22}N_2O_4)$ Required: C, 61.22; H, 7.48; N, 9.52%. Found: C, 59.61; H, 7.34; N, 10.65%.

N.M.R. spectroscopy analysis gave a monomer ratio of 1.8:1.

EXAMPLE 27—Quaternization of Polymers (a), (b) and (c) of the Above Example With Chloromethylcarbonyloxyethylmethacrylate The method of Example 14 was applied but the following amounts were used:

|  | (a) | (b) | (c) |
|---|---|---|---|
| Polymer | 9.7 g | 10 g | 9.7 |
| Chloromethylcarbonyl-oxyethylmethacrylate | 10.3 g | 10.3 g | 12.35 |
| D.M.F. | 100 ml | 100 ml | 100 ml |
| Yields | 13 g | 17 g | 16.7 g |
| % Cl found | 6.55% | 8.03% | 7.59% |

EXAMPLE 28—Synthesis of Poly(acrylonitrile)-co-(N-vinylimidazole)

Acrylonitrile (10.6 g), and N-vinylimidazole (18.8 g) were dissolved in dioxane (75 ml) in a 250 ml, three-necked round-bottomed flask, fitted with a magnetic stirrer, nitrogen inlet and reflux condenser. The apparatus was placed in a thermostated oil bath set at 65° C. and nitrogen was bubbled continuously through the solution. A.I.B.N. (0.14 g) was added. After 30 minutes, the polymer began to precipitate. After 4 hours the reaction was stopped, the precipitated polymer was filtered, and thoroughly washed with ether. The polymer was then collected and dried under vacuum (25 g).

$(C_8H_9N_3)_n$ Required: C, 65.3; H, 6.12; N, 28.57%. Found: C, 62.42; H, 6.1; N, 25.60%.

N.M.R. spectroscopy analysis showed that the ratio of acrylonitrile to N-vinylimidazole was 1:1.

EXAMPLE 29—Quaternization of Poly(acrylonitrile)-co-(N-vinylimidazole) With Chloromethylcarbonyloxyethylmethacrylate The method of Example 14 was employed using the following charge:

| Poly(acrylonitrile)-co-(N-vinylimidazole) | 7.4 g |
|---|---|
| Chloromethylcarbonyloxyethylmethacrylate | 10.3 g |
| DMF | 75 ml |

The quaternized polymer (12 g) was a colorless powder.

$(C_{16}H_{20}ClN_3O_4)_n$ Required: C, 54.31; H, 5.65; Cl, 10.04; N, 11.88%. Found: C, 51.60; H, 5.85; Cl, 9.36; N, 11.67%.

The following compounds are bromine derivatives which are not unsaturated and which can be used in the process.

EXAMPLE 30—Synthesis of n-Butyltribromoacetate n-Butanol (7.4 g) and tribromoacetic acid (29.6 g) were dissolved in toluene (100 ml). p-Toluenesulfonic acid (0.7 g) was added, and the solution was heated under reflux in a Dean and Stark apparatus. After 90 minutes water (2 ml) had been collected. The solvent was spun off on a rotary evaporator and the residue was distilled under water pump vacuum, collecting the fraction boiling between 120°–130° C. The fraction was redistilled yielding a colorless oil b.p. 128° C./15–18 mm (31 g).

$(C_6H_9Br_3O_2)$ Required: C, 20.39; H, 2.55; Br, 67.99%. Found: C, 20.42; H, 2.48; Br, 67.40%.

EXAMPLE 31—Synthesis of n-Lauryltribromoacetate

This was prepared by the same method as described for n-butyltribromoacetate. Dodecanol (18.8 g), tribromoacetic acid (29.7 g) and p-toluenesulfonic acid (1 g) were used. The product was distilled twice under high vacuum yielding a colorless oil, b.p. 150°–154° C./0.05 mm.

$C_{14}H_{25}Br_3O_2$ Required: C, 36.13; H, 5.37; Br, 51.61%. Found: C, 36.84; H, 5.54; Br, 47.86%.

The invention has been described in detail with particular reference to preferred embodiments thereof, but it will be understood that variations and modifications can be effected within the spirit and scope of the invention.

What is claimed is:

1. A water-developable, radiation-sensitive composition comprising
   (a) a polymer containing a recurring unit with the structure

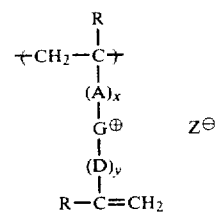

wherein G is a 5-membered ring containing a quaternized nitrogen;

each R independently represents —H or —CH$_3$;

A is alkylene; oxyalkylene;

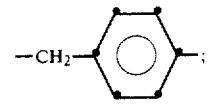

—COO(CH$_2$)$_a$OOCCH$_2$—; or —CONH(CH$_2$)$_b$-HNOCCH$_2$—;

D is alkylene; oxyalkylene; —CH$_2$COOCH$_2$C-H$_2$OOC—; —CH$_2$CONH(CH$_2$)$_b$HNOC—; —(CH$_2$)$_b$OOC—;

or 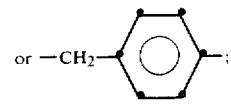

a represents 1, 2 or 3;

b represents 2 or 3;

x represents 0 or 1;

y represents 0 or 1; and

Z$^\ominus$ is an anion; and (b) a photoinitiator comprising a trihalomethane derivative and a metal carbonyl compound or a metallocene.

2. A composition as claimed in claim 1 wherein the polymer is a copolymer.

3. A composition as claimed in claim 1 or 2 wherein the polymer is a copolymer containing recurring units having the formula

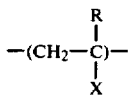

wherein
R represents —H or —CH₃; and
X is phenyl; —CN; —COOR₃; or

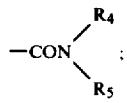

R₃ is alkyl having from 1 to 4 carbon atoms; and,
R₄ and R₅, independently, is —H or alkyl having from 1 to 4 carbon atoms.

4. A composition as claimed in claim 1 or 2 wherein said photoinitiator comprises a metal carbonyl compound represented by the formula ArM(CO)₃ wherein Ar represents a six-electron donor ligand and M represents a metal of Group VIa of the Mendeleeff periodic table.

5. A composition as claimed in claim 4 wherein the metal carbonyl compound or metallocene is present in an amount of from 1 to 20 percent by weight based on the weight of the polymer.

6. A composition as claimed in claim 5 wherein the metal carbonyl compound or metallocene is present in an amount of from 2 to 5 percent by weight based on the weight of the polymer.

7. A composition as claimed in claim 1 or 2 wherein the trihalomethane derivative is an ethylenically unsaturated monomer which is copolymerizable with the polymer.

8. A composition as claimed in claim 7 wherein the trihalomethane derivative is present in an amount of from 5 to 80 percent by weight based on the weight of the polymer.

9. A composition as claimed in claim 1 or 2 and further including one or more copolymerizable monomers.

10. A radiation-sensitive element comprising a support bearing a composition comprising
(a) a polymer containing a recurring unit with the structure

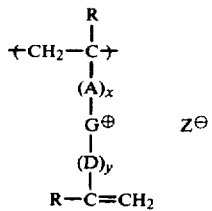

wherein G is a 5-membered ring containing a quaternized nitrogen;
each R independently represents —H or —CH₃;
A is alkylene; oxyalkylene;

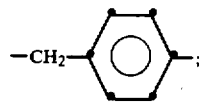

—COO(CH₂)ₐOOCCH₂—; or —CONH(CH₂)ᵦHNOCCH₂—;

D is alkylene; oxyalkylene; —CH₂COOCH₂CH₂OOC—; —CH₂CONH(CH₂)ᵦHNOC—; —(CH₂)ᵦOOC—;

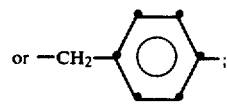

a represents 1, 2 or 3;
b represents 2 or 3;
x represents 0 or 1;
y represents 0 or 1; and
Z⊖ is an anion; and
(b) an initiator comprising a trihalomethane derivative and a metal carbonyl compound or a metallocene.

* * * * *